(12) United States Patent
Kim

(10) Patent No.: US 9,147,482 B2
(45) Date of Patent: Sep. 29, 2015

(54) DATA TRANSMISSION CIRCUIT, MEMORY INCLUDING THE SAME, AND DATA TRANSMISSION METHOD

(71) Applicant: SK hynix Inc., Gyeonggi-do (KR)

(72) Inventor: Min-Su Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 164 days.

(21) Appl. No.: 13/843,580

(22) Filed: Mar. 15, 2013

(65) Prior Publication Data

US 2014/0169094 A1      Jun. 19, 2014

(30) Foreign Application Priority Data

Dec. 17, 2012   (KR) .......................... 10-2012-0147626

(51) Int. Cl.
*G11C 16/10*   (2006.01)
*G11C 16/26*   (2006.01)

(52) U.S. Cl.
CPC ..................................... *G11C 16/26* (2013.01)

(58) Field of Classification Search
CPC ........................................................ G11C 16/10
USPC ...................................................... 365/189.05
See application file for complete search history.

(56) References Cited

U.S. PATENT DOCUMENTS

| 2009/0154265 | A1* | 6/2009 | Kim et al. ................. 365/189.16 |
| 2010/0259963 | A1* | 10/2010 | Won et al. ........................ 365/63 |
| 2012/0099390 | A1* | 4/2012 | Cho .............................. 365/203 |
| 2013/0315013 | A1* | 11/2013 | Kim ......................... 365/189.16 |

FOREIGN PATENT DOCUMENTS

| KR | 1020100134235 | 12/2010 |
| KR | 1020110078732 | 7/2011 |

* cited by examiner

*Primary Examiner* — Amir Zarabian
*Assistant Examiner* — Min Huang
(74) *Attorney, Agent, or Firm* — IP & T Group LLP

(57) ABSTRACT

A data transmission circuit includes an input line selection unit configured to transfer data of a selected input line among a plurality of input lines to an output line, a data sensing unit connected to the plurality of input lines and configured to sense the data of the selected input line, and a data amplification unit configured to amplify data of the output line in response to a data sensing result of the data sensing unit.

14 Claims, 5 Drawing Sheets

DATA TRANSMISSION CIRCUIT, MEMORY INCLUDING THE SAME, AND DATA TRANSMISSION METHOD

CROSS-REFERENCE TO RELATED APPLICATIONS

The present application claims priority of Korean Patent Application No. 10-2012-0147626, filed on Dec. 17, 2012, which is incorporated herein by reference in its entirety.

BACKGROUND

1. Field

Exemplary embodiments of the present invention relate to a data transmission circuit for operating a memory at high speed, a memory including the same, and a data transmission method.

2. Description of the Related Art

A nonvolatile memory is a memory device which maintains data stored therein even though power supply is cut off. As the threshold voltage of a memory cell may change based on the amount of charges stored in a conduction band of a floating gate, data is stored in the nonvolatile memory using the characteristics.

When a program pulse is applied to the floating gate, the threshold voltage of the memory cell increases. Depending on the value of data to be stored in the memory cell through the program pulse, the threshold voltage of the memory cell is changed. Since a plurality of memory cells within the nonvolatile memory have different characteristics, the threshold voltages of memory cells storing the same data do not have one value, but form a predetermined distribution.

Meanwhile, a plurality of memory cells in the nonvolatile memory are connected to corresponding bit lines. Each of the bit lines is coupled to a corresponding page buffer. The page buffer drives the bit line to a predetermined voltage level, senses the voltage of the bit line, and store or output the sensed value, in order to perform a specific operation such as a read or write operation for a selected memory cell. The page buffer includes one or more latches configured to perform an operation of storing data inputted from outside and driving a bit line to a predetermined voltage, or an operation of sensing the voltage of the bit line to store data corresponding to the voltage of the bit line and transferring the stored voltage to the outside.

Among the latches included in the page buffer, a cache latch serves to store data of a selected memory cell during a data read operation, and to drive a line for transferring data to the outside depending on the stored data. Hereafter, referring to FIG. 1, how the data stored in the cache latch of the page buffer is transferred to the outside of the page buffer will be described.

FIG. 1 is a diagram illustrating a part of a conventional memory, in order to describe a process in which data of a cache latch is transferred in the conventional memory.

Referring to FIG. 1, the memory includes a plurality of page buffer groups PG0 to PGN, a plurality of data transmission lines IO_0/IO_0B to IO_N/IO_NB, and an output line OUT/OUTB. Each of the page buffer groups PG0 to PGN includes one or more page buffers PB0 to PBM. The plurality of data transmission lines IO_0/IO_0B to IO_N/IO_NB correspond to the respective page buffer groups PG0 to PGN and are configured to transfer data of a selected page buffer among page buffers PB0 to PBM included in each of the page buffer groups PG0 to PGN. The output line OUT/OUTB is configured to transfer data of a selected transmission line among the plurality of data transmission lines IO_0B/IO_0B to IO_N/IO_NB. Each of the page buffers includes a cache latch LAT.

Referring to FIG. 1, an operation of outputting data of a selected page buffer will be described. The memory transfers differential data through the data transmission lines IO_0 to IO_N and OUT to transfer data and the complementary data transmission lines IO_0B to IO_NB and OUTB to transfer complementary data.

The page buffers PB0 to PBM included in one page buffer group are connected to the data transmission lines IO_0/IO_0B to IO_N/IO_NB corresponding to the respective page buffer groups through the respective switches SWB0 to SWBM. Furthermore, the data transmission lines corresponding to the respective page buffer groups are connected to the output line OUT/OUTB through the respective switches SWG0 to SWGN.

During a read operation, a page buffer group including a page buffer having data to be read is selected, and a switch corresponding to the selected page buffer group is turned on to electrically connect a data transmission line corresponding to the selected page buffer group to the output line OUT/OUTB. Furthermore, the page buffer having data to be read is selected, and a switch connected to the selected page buffer is turned on to electrically connect the selected page buffer to the data transmission line. Here, selection signals SEL_PB0<0:M> to SEL_PBM<0:N> to select the respective page buffers PB0 to PBM and selection signals SEL_PG<0:N> to select the respective page buffer groups PG0 to PGN may be generated by decoding an address (not illustrated in FIG. 1) inputted to the memory.

For example, it is supposed that data of the first page buffer PB0 of the first page buffer group PG0 is read. The selection signal SEL_PG<0> is activated to select the first page buffer group PG0, and the selection signal SEL_PB0<0> is activated to select one page buffer among the page buffers PB0 to PBM included in the first page buffer group PG0. When the page buffer group PG0 and the page buffer PB0 included in the page buffer group PG0 are selected, the switch SWG0 is turned on in response to the selection signal SEL_PG<0>, and the switch SWB0 is turned on in response to the selection signal SEL_PB0<0>. Therefore, the cache latch LAT included in the page buffer PB0 of the page group PG0 is electrically connected to the output line OUT/OUTB.

In order for the output line OUT/OUTB to receive data included in the cache latch LAT, the output line OUT/OUTB is precharged to a precharge voltage before the data read operation is started. When the cache latch LAT and the output line OUT/OUTB are electrically connected to each other during the read operation, the output line OUT/OUTB is driven to a predetermined voltage by the cache latch LAT.

Here, the number of page buffer groups connected to one output line OUT/OUTB and the number of page buffers included in one page buffer group approaches several tens to hundreds. Therefore, the loading of the output line OUT/OUTB is significantly large. However, since the output line OUT/OUTB is driven only by the cache latch LAT, it takes a considerably long time to drive the voltage of the output line OUT/OUTB to a voltage corresponding to data which is to be outputted. When it takes a considerably long time to drive the output line OUT/OUTB, it means that the memory has difficulties in operating at high speed.

SUMMARY

Various embodiments are directed to a data transmission circuit capable of sensing data of an input line and amplifying data of an output line according to the sensing result, in order to transfer the data of the input line to the output line at high speed, a memory including the same, and a data transmission method.

Also, various embodiments are directed to a memory capable of transferring data of an input line to an output line at high speed, thereby operating at high speed.

In an embodiment, a data transmission circuit includes an input line selection unit configured to transfer data of a selected input line among a plurality of input lines to an output line, a data sensing unit connected to the plurality of input lines and configured to sense the data of the selected input line, and a data amplification unit configured to amplify data of the output line in response to a data sensing result of the data sensing unit.

In another embodiment, a data transfer circuit includes a first data sensing unit configured to sense data of a first input line in response to a first sensing signal and to generate a first result signal, a second data sensing unit configured to sense data of a second input line in response to a second sensing signal and generate a second result signal, a first switch configured to electrically connect the first input line and the output line in response to a first selection signal, a second switch configured to electrically connect the second input line and the output line in response to a second selection signal, and a data amplification unit configured to amplify data of the output line in response to an activated result signal of the first and second result signals.

In yet another embodiment, a memory includes a plurality of page buffer groups each including one or more page buffers configured to sense and output data of a bit line, a plurality of data transmission lines corresponding to the respective page buffer groups and each configured to transfer data of a selected page buffer among the page buffers included in a corresponding page buffer group, and a plurality of data transmission units corresponding to the respective data transmission lines and each configured to transfer data of a corresponding data transmission line to an output line when the corresponding data transmission line is selected, electrically connect the corresponding data transmission line to the output line, and amplify data of the output line according to a sensing result obtained by sensing data on the corresponding data transmission line.

In still another embodiment, there is provided a data transmission method which transfers data of one input line among a plurality of input lines to an output line. The data transmission method includes electrically connecting a selected input line among the plurality of input lines to the output line, sensing data of the selected input line, and amplifying data of the output line in response to a result obtained by sensing the data of the selected input line.

The data transmission method, wherein the sensing of the data of the selected input line comprises sensing the data of the selected input line in response to a voltage level of the selected input line.

The data transmission method, wherein the amplifying of the data of the output line comprises driving the output line to a predetermined voltage in response to the data sensing result of the selected input line.

The data transmission method, wherein the output line is driven to the precharge voltage, before the selected input line is electrically connected to the output line.

DETAILED DESCRIPTION

Figure 1:
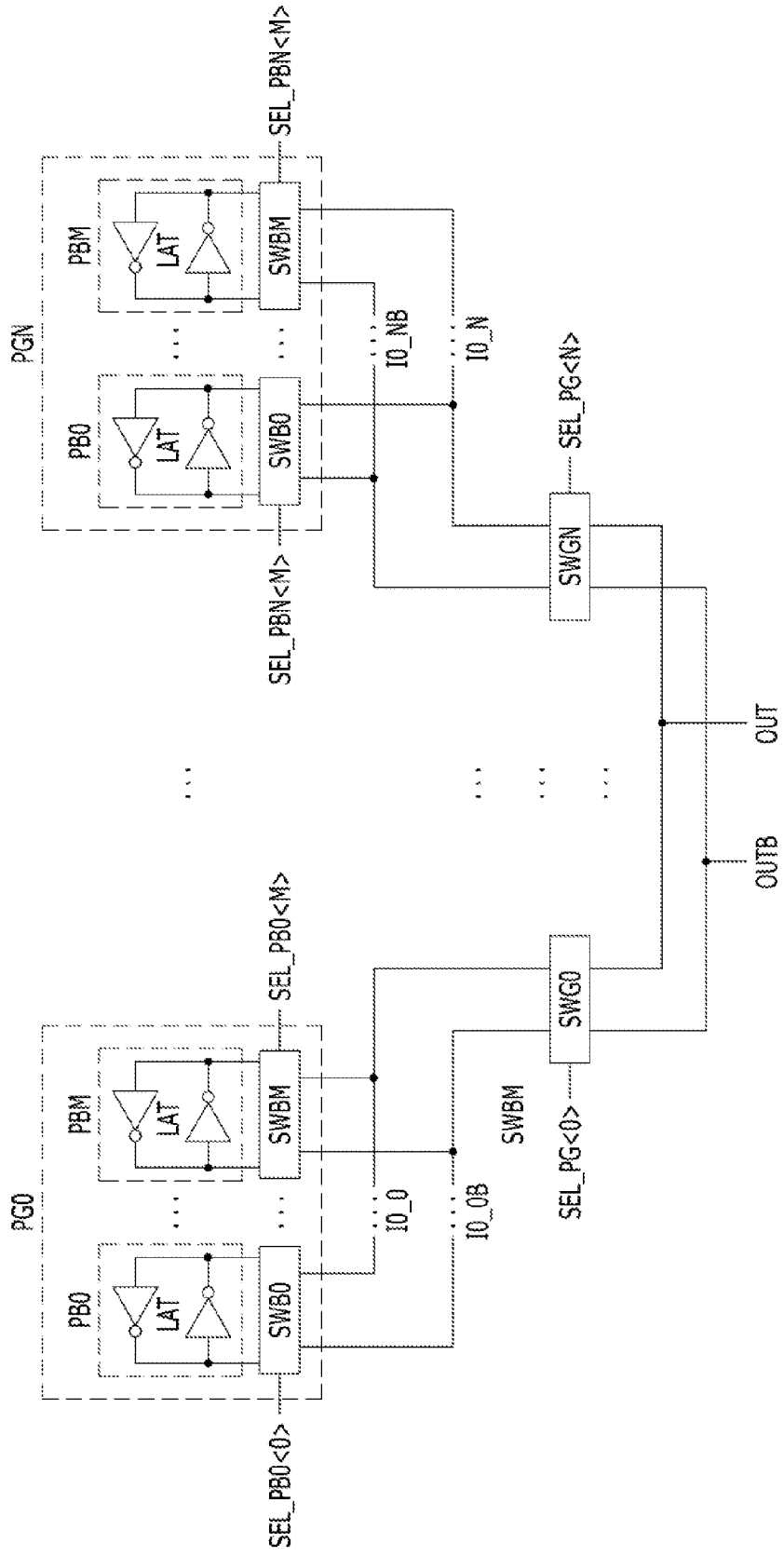
FIG. 1 is a diagram illustrating a part of a conventional memory, in order to describe a process in which data of a cache latch is transferred in the conventional memory.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
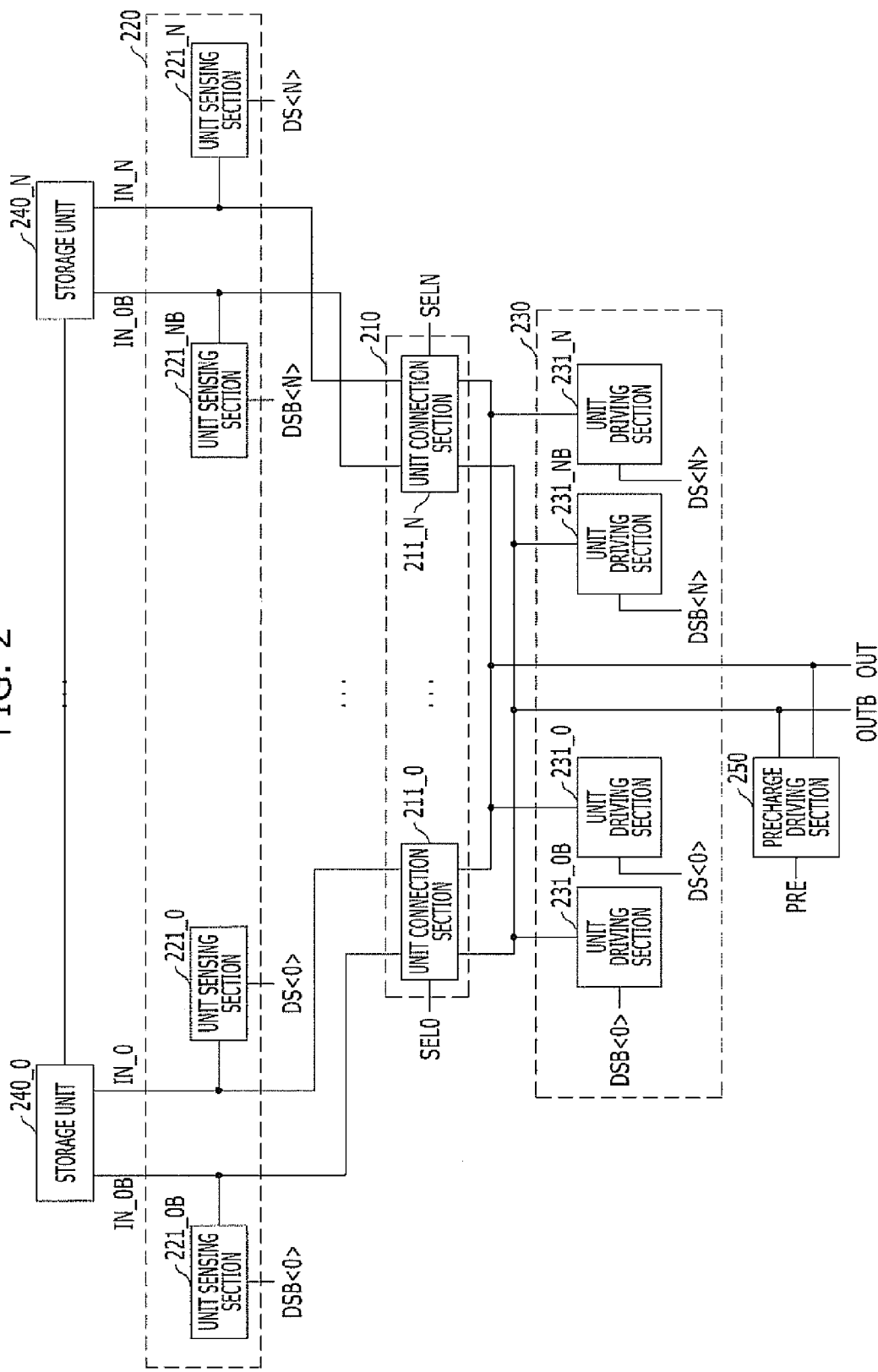
FIG. 2 is a diagram illustrating a data transmission circuit in accordance with an embodiment of the present invention.

FIG. 2 is a diagram illustrating a data transmission circuit in accordance with an embodiment of the present invention.

Referring to FIG. 2, the data transmission circuit in accordance with the embodiment of the present invention may include an input line selection unit 210, a data sensing unit 220, and a data amplification unit 230. The input line selection unit 210 is configured to transfer data of a selected input line among a plurality of input lines IN_0/IN_0B to IN_N/IN_NB to an output line OUT/OUTB. The data sensing unit 220 is coupled to the plurality of input lines IN_0/IN_0B to IN_N/IN_NB and configured to sense the data of the selected input line. The data amplification unit 230 is configured to amplify data of the output line OUT/OUTB in response to the data sensing result of the data sensing unit 220. A memory may include a plurality of data storage units 240_0 to 240_N corresponding to the respective input lines IN_0/IN_0B to IN_N/IN_NB. The respective data storage units 240_0 to 240_N are configured to store data and transfer the stored data to the corresponding input lines during a read operation. Furthermore, the memory may include a precharge driving unit 250 configured to drive the output line OUT/OUTB to a precharge voltage before the data of the selected input line is sensed.

Referring to FIG. 2, the data transmission circuit will be described.

The data storage units 240_0 to 240_N store data, and transfer the stored data to the corresponding input lines IN_0/IN_0B to IN_N/IN_NB during a read operation. More specifically, the data storage units 240_0 to 240_N drive the corresponding input lines IN_0/IN_0B to IN_N/IN_NB to a voltage corresponding to a value of the stored data. For example, when the first data storage unit 240_0 stores high level data, the first data storage unit 240_0 drives the first input line IN_0 to a voltage corresponding to the high level data. Since the first input line IN_0 is an input line to transfer positive data, the voltage of the first input line IN_0 is driven to the voltage corresponding to a high level. Furthermore, since the first input line IN_0B is an input line to transfer complementary data, the voltage of the first input line IN_0B is driven to a voltage corresponding to data obtained by inverting the data loaded in the first input line IN_0. In this embodiment of the present invention, it has been described that each of the data storage units 240_0 to 240_N stores one value and transfers the stored value to a corresponding input line. However, each of the data storage units 240_0 to 240_N may store several data, select one of the stored data, and transfer the selected data to a corresponding input line.

The input line selection unit 210 transfers data of a selected input line among the plurality of input lines IN_0/IN_0B to IN_N/IN_NB to the output line OUT/OUTB. More specifically, the input line selection unit 210 electrically connects the selected input line of the input lines IN_0/IN_0B to IN_N/IN_NB to the output line OUT/OUTB in response to an activated selection signal among a plurality of selection signals SEL0 to SELN.

For this operation, the input line selection unit 210 includes a plurality of unit connection units 211_0 to 211_N each configured to electrically connect a corresponding input line of the input lines IN_0/IN_0B to IN_N/IN_NB to the output line OUT/OUTB when the corresponding input line is selected. Each of the unit connection units 211_0 to 211_N may include a switch which is turned on when a corresponding selection signal among the plurality of selection signals SEL0 to SELN is activated.

The data sensing unit 220 is coupled to the plurality of input lines IN_0/IN_0B to IN_N/IN_NB, and senses the data of the selected input line. More specifically, the data sensing unit 220 may sense the data of the selected input line among the plurality of input lines IN_0/IN_0B to IN_N/IN_NB in response to the voltage of the selected input line, and generate result information DS<0:N> and DSB<0:N>. For example, when the value of the data transferred through the selected input line is high, the input line to transfer positive data is driven to a voltage corresponding to a high level, and the input line to transfer complementary data is driven to a voltage corresponding to a low level. Therefore, the data sensing unit 220 may sense the data transferred to each of the input lines through the voltage level of the input line. The result information DS<0:N> may include results obtained by sensing the data of the input lines IN_0 to IN_N to transfer data, and the result information DSB<0:N> may include results obtained by sensing the data of the input lines IN_0B to IN_NB to transfer complementary data.

For this operation, the data sensing unit 220 includes a plurality of unit sensing sections 221_0/221_0B to 221_N/221_NB each electrically connected to a corresponding input line of the input lines IN_0/IN_0B to IN_N/IN_NB and configured to generate a result signal (corresponding to each of the result information DS<0:N> and DSB<0:N>) in response to the voltage of the corresponding input line when the corresponding input line is selected. A unit sensing section corresponding to the selected input line generates a result signal corresponding to the data of the selected input line in response to the voltage of the selected input line. For example, when the input line IN_0/IN_0B is selected, the unit sensing section 221_0/221_0B changes the result signal DS<0> to a high level and changes the result signal DSB<0> to a low level or changes the result signal DS<0> to a low level and changes the result signal DSB<0> to a high level, in response to the voltage of the selected input line IN_0/IN_0B. Among the result signal DS<0:N> and DSB<0:N>, all of the result signals corresponding to unselected input lines are deactivated regardless of data loaded in the input lines.

The data amplification unit 230 amplifies the data of the output line OUT/OUTB in response to the data sensing result of the data sensing unit 220, that is, the result signal DS<0:N> and DSB<0:N>. More specifically, the data amplification unit 230 drives the output line OUT/OUTB to a predetermined voltage in response to the result signal DS<0:N> and DSB<0:N>. The output line OUT/OUTB is driven to a precharge voltage by the precharge driving unit 250, before a read operation is started. The voltage level of the precharge voltage may differ depending on design. Hereafter, a case in which the precharge voltage is equal to a power supply voltage VDD will be described. When high data is loaded in the input line to transfer data and low data is loaded in the input line to transfer complementary data in the selected input line, the data amplification unit 230 pull-down drives the output line OUTB to transfer complementary data, in the output line. This operation increases a voltage difference between the output line OUT to transfer positive data and the complementary output line OUTB to transfer complementary data.

For this operation, the data amplification unit 230 includes a plurality of unit driving sections 231_0/231_0B to 231_N/231_NB each configured to drive the output line OUT/OUTB to a predetermined voltage in response to a result signal of a corresponding unit sensing section of the unit sensing sections 221_0/221_0B to 221_N/221_NB. Each of the unit driving sections 221_0/221_0B to 221_N/221_NB drives the output line OUT/OUTB to a predetermined voltage in response to the corresponding result signal of the result signal DS<0:N> and DSB<0:N>. For example, when the input line IN_0/IN_0B is selected, high data is loaded in the input line IN_0, and low data is loaded in the input line IN_0B, the result signals DS<0> and DSB<0> have a corresponding value, and the other result signals DS<1:N> and DSB<1:N> are deactivated. Therefore, the unit driving section 231_0 maintains the voltage of the output line OUT at the power supply voltage VDD, and the unit driving section 231_0B pull-down drives the complementary output line OUTB. Since all of the unit driving sections 231_0 to 231_N and 231_0B to 231_NB are disabled, they have no effect on the voltage of the output line OUT/OUTB.

Based on the above-described configuration, the entire operation of the data transmission circuit when the data of the storage unit 240_0 is read will be described.

Before a read operation is started, the precharge driving unit 250 drives the output line OUT/OUTB to a precharge voltage in a state in which a precharge signal PRE is activated. When the read operation is started, the data stored in the storage unit 240_0 is loaded into the input line IN_0/IN_0B, and the data transmission unit 210 electrically connects the selected input line IN_0/IN_0B to the output line OUT/OUTB in response to the activated selection signal SEL0 among the plurality of selection signals SEL0 to SELN. In addition, the data sensing unit 220 senses data of the selected input line IN_0/IN_0B and generates result signals DS<0> and DSB<0> corresponding to the sensing result. The data amplification unit 230 maintains the voltage of a line to transfer high data between the output lines OUT and OUTB at the power supply voltage VDD in response to the result signals DS<0> and DSB<0>, and pull-down drives the voltage of a line to transfer low data. The output line OUT/OUTB is electrically connected to the selected input line IN_0/IN_0B, and additionally driven according to the data sensing result of the selected input line IN_0/IN_0B. Therefore, the data of the input line are transferred to the output line at high speed.

The data transmission circuit in accordance with the embodiment of the present invention not only electrically connects the selected input line to the output line, but also senses the data of the selected input line to additionally drive the output line. Therefore, the output line is driven to a voltage corresponding to the data loaded in the selected input line at a much higher speed than in the conventional data transmission circuit. That is, the data of the input line are transferred to the output line at a much higher speed than the conventional data transmission circuit. Therefore, the data transmission operation may be performed at high speed.

Figure 3:
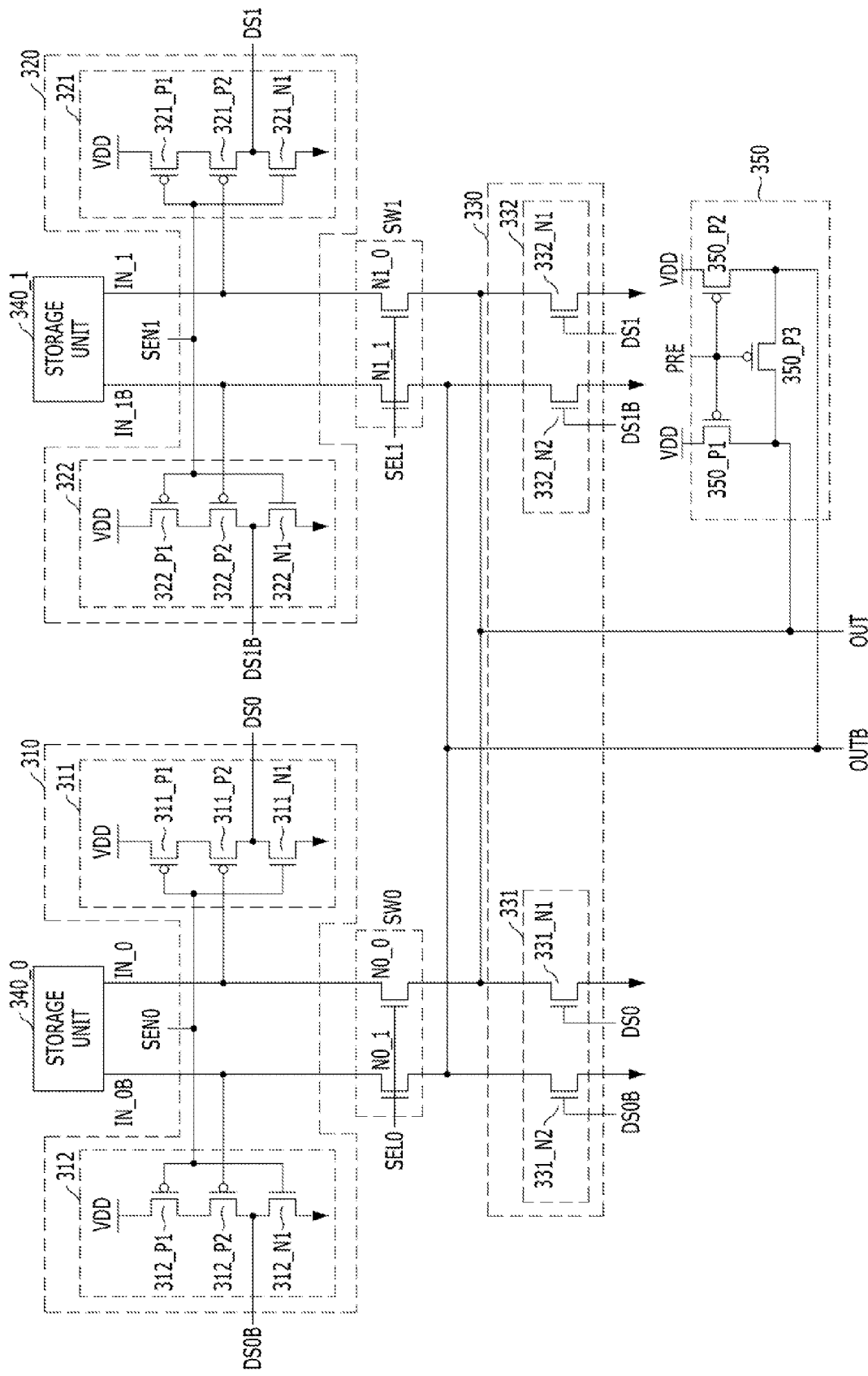
FIG. 3 is a diagram illustrating a data transmission circuit in accordance with another embodiment of the present invention.

FIG. 3 is a diagram illustrating a data transmission circuit in accordance with another embodiment of the present invention.

Referring to FIG. 3, the data transmission circuit includes a first data sensing unit 310, a second data sensing unit 320, a first switch SW0, a second switch SW1, and a data amplification unit 330. The first data sensing unit 310 is configured to sense data of a first input line IN_0/IN_0B in response to a first sensing signal SEN0 and to generate a first result signal DS0/DSB0. The second data sensing unit 320 is configured to sense data of a second input line IN_1/IN_1B in response to a second sensing signal SEN1 and to generate a second result signal DS1/DSB1. The first switch SW0 is configured to electrically connect the first input line IN_0/IN_0B and an output line OUT/OUTB in response to a first selection signal SEL0. The second switch SW1 is configured to electrically connect the second input line IN_1/IN_1B and the output line OUT/OUTB in response to a second selection signal SEL1. The data amplification unit 330 is configured to amplify data of the output line OUT/OUTB in response to an activated result signal of the first and second result signals DS0/DSB0 and DS1/DSB1. A memory includes a first storage unit 340_0, a second storage unit 340_1, and a precharge driving unit 350. The first storage unit 340_0 is connected to the first input lines IN_0 and IN_0B. The second storage unit 340_1 is connected to the second input lines IN_1 and IN_1B. The precharge driving unit 350 is configured to drive the output line OUT/OUTB to a precharge voltage before the data of the first input line IN_0/IN_0B and the second input line IN_1/IN_1B are sensed.

Referring to FIG. 3, the data transmission circuit will be described.

The first and second storage units 340_0 and 340_1 store data and transfer the stored data to a corresponding input line of the first input line IN_0/IN_0B and the second input line IN_1/IN_1B during a read operation. When the read operation is started, one of the first and second selection signals SEL1 and SEL2 is activated, and a switch corresponding to the activated selection signal of the first and second switches SW0 and SW1 is turned on. Therefore, an input line connected to the turned-on switch is electrically connected to the output line OUT/OUTB. The first switch SW0 includes two transistors N0_0 and N0_1 connected between the input line IN_0 to transfer data and the output line OUT to transfer the data and connected between the complementary input line IN_0B to transfer complementary data and the complementary output line OUTB to transfer the complementary data. The second switch SW1 includes two transistors N1_0 and N1_1 connected between the input line IN_1 to transfer data and the output line OUT to transfer the data and connected between the complementary input line IN_1B to transfer complementary data and the complementary output line OUTB to transfer the complementary data.

Furthermore, between the first and second sensing signals SEN0 and SEN1, a sensing signal corresponding to the selected input line is activated. Between the first and second sensing units 310 and 320, a data sensing unit corresponding to the activated sensing signal senses data of a corresponding input line and activates a result signal.

For this operation, the first and second data sensing units 310 and 320 may include first data sensing sections 311 and 321 connected to the input lines to transfer data and second data sensing sections 312 and 322 connected to the input lines to transfer complementary data, respectively.

The first data sensing section 311 and the complementary data sensing section 312 included in the first data sensing unit 310 will be described. The first data sensing section 311 includes two PMOS transistors 311_P1 and 311_P2 and one NMOS transistor 311_N1. The PMOS transistor 311_P1 and the NMOS transistor 311_N1 are turned on/off in response to the first sensing signal SEN0. The PMOS transistor 311_P2 is turned on/off in response to the voltage of the first input line IN_0 to transfer data.

When the first sensing signal SEN0 is deactivated to a high level, the PMOS transistor 311_P1 is turned off, and the NMOS transistor 311_N1 is turned on. Therefore, the first result signal DS0 indicating a result obtained by sensing the data of the first input line IN_0 is deactivated to a low level. When the first sensing signal SEN0 is activated to a low level, the PMOS transistor 311_P1 is turned on, and the NMOS transistor 311_N1 is turned off. The on/off of the PMOS transistor 311_P2 is decided in response to the voltage of the first input line IN_0. When the voltage of the first input line IN_0 corresponds to a high level, the PMOS transistor 311_P2 is turned off. Therefore, the first result signal DS0 maintains a deactivation (low) state. When the voltage of the first input line IN_0 corresponds to a low level, the PMOS transistor 311_P2 is turned on. Therefore, the first result signal DS0 is activated (high). The primary data sensing unit 311 generates the first result signal DS0 corresponding to the data sensing result of the first input line IN_0.

The second data sensing section 312 includes two PMOS transistors 312_P1 and 312_P2 and one NMOS transistor 312_N1, like the first data sensing section 311. Except that the PMOS transistor 312_P2 is turned on/off in response to the voltage of the first input line IN_0B to transfer complementary data, the operation of the second data sensing unit 312 is performed in the same manner as the operation of the first data sensing section 311. The second data sensing section 312 generates the first result signal DS0B corresponding to the data sensing result of the first input line IN_0B.

The first data sensing section 321 and the second data sensing section 322 included in the second data sensing unit 320 will be described. The first data sensing section 321 includes two PMOS transistors 321_P1 and 321_P2 and one NMOS transistor 321_N1. The PMOS transistor 321_P1 and the NMOS transistor 321_N1 are turned on/off in response to the second sensing signal SEN1. The PMOS transistor 321_P2 is turned on/off in response to the voltage of the second input line IN_1 to transfer data.

When the second sensing signal SEN1 is deactivated to a high level, the PMOS transistor 321_P1 is turned off, and the NMOS transistor 321_N1 is turned on. Therefore, the second result signal DS1 indicating a result obtained by sensing the data of the second input line IN_1 is deactivated to a low level. When the second sensing signal SEN1 is activated to a low level, the PMOS transistor 321_P1 is turned on, and the NMOS transistor 321_N1 is turned off. The on/off of the PMOS transistor 321_P2 is decided in response to the voltage of the input line IN_1. When the voltage of the second input line IN_1 corresponds to a high level, the PMOS transistor 321_P2 is turned off. Therefore, the second result signal DS1 maintains a deactivation (low) state. When the voltage of the input line IN_1 corresponds to a low level, the PMOS transistor 321_P2 is turned on. Therefore, the second result signal DS1 is activated to a high level. The first data sensing section 321 generates the second result signal DS1 corresponding to the result obtained by sensing the data of the second input line IN_1.

The second data sensing section 322 includes two PMOS transistors 322_P1 and 322_P2 and one NMOS transistor 322_N1, like the first data sensing section 321. Except that the PMOS transistor 322_P2 is turned on/off in response to the voltage of the second input line IN_1B to transfer complementary data, the operation of the second data sensing section 322 is performed in the same manner as the first data sensing section 321. The second data sensing section 322 generates the second result signal DS1B corresponding to the result obtained by sensing the data of the second input line IN_1B.

The data amplification unit 330 amplifies the data of the output line OUT/OUTB in response to the activated result signal. More specifically, the data amplification unit 330 drives the voltage of the precharged output line OUT/OUTB to a predetermined voltage in response to an activated result signal between the first signal DS0/DSB0 and the second result signal DS1/DSB1. For this operation, the data amplification unit 330 includes a first driving section 331 and a second driving section 332. The first driving section 331 is configured to drive the output line OUT/OUTB to a predetermined voltage in response to the first result signal DS0/DSB0. The second driving section 332 is configured to drive the output line OUT/OUTB to a predetermined voltage in response to the second result signal DS0/DSB0.

The first driving section 331 includes NMOS transistors 331_N1 and 331_N2. The NMOS transistor 331_N1 is turned on when the first result signal DS0 corresponding to the result obtained by sensing the data of the first input line IN_0 is activated, and pull-down drives the output line OUT to transfer data. The NMOS transistor 331_N2 is turned on when the first result signal DS0B corresponding to the result obtained by sensing the data of the first input line IN_0B is activated, and pull-down drives the output line OUTB to transfer complementary data.

The second driving section 332 includes NMOS transistors 332_N1 and 332_N2. The NMOS transistor 332_N1 is turned on when the second result signal DS1 corresponding to the result obtained by sensing the data of the second input line IN_1 is activated, and pull-down drives the output line OUT to transfer data. The NMOS transistor 332_N2 is turned on when the second result signal DS1B corresponding to the result obtained by sensing the data of the second input line IN_1B is activated, and pull-down drives the output line OUTB to transfer complementary data.

The precharge driving unit 350 drives the output line OUT/OUTB to a precharge voltage before a read operation is performed. More specifically, the precharge driving unit 350 pull-up drives the output line OUT to transfer data and the output line OUTB to transfer complementary data, before the read operation is performed, or particularly, before the data of the first input line IN_0/IN_0B and the second input line IN_1 and IN_1B are sensed, and electrically connects the output line OUT to transfer data and the output line OUTB to transfer complementary data such that the voltage of the output line OUT is equalized to the voltage of the output line OUTB.

For this operation, the precharge driving unit 350 includes two PMOS transistors 350_P1 and 350_P2 configured to pull-up drive the output line OUT to transfer data and the output line OUTB to transfer complementary data, when the a precharge signal PRE activated during a precharge period is activated to a low level, and one PMOS transistor 350_P3 configured to electrically connect the output line OUT to transfer data and the complementary output line OUTB to transfer complementary data.

Based on the above-described configuration, the entire operation of the data transmission circuit when the data of the first storage unit 340_0 is read will be described.

Before a read operation is started, all of the three PMOS transistors 350_P1, 350_P2, and 350_P3 of the precharge driving unit 350 are turned on to drive the output lines OUT and OUTB to the same precharge voltage in a state in which the precharge signal PRE is activated. When the read operation is started, the precharge signal PRE is deactivated, and the data stored in the first storage unit 340_0 is transferred to the first input line IN_0/IN_0B. When the first selection signal SEL0 is activated, the first switch SW0 electrically connects the first input line IN_0/IN_0B to the output line OUT/OUTB. When the first sensing signal SEN0 is activated together with the first selection signal SEL0, the first data sensing unit 310 senses the data of the first input line IN_0/IN_0B and generates the first result signals DS0 and DS0B. The data amplification unit 340 amplifies the data of the output line OUT/OUTB in response to the first result signals DS0 and DS0B.

For example, when high data is loaded in the first input line IN_0 to transfer data (low data is loaded in the first input line IN_0B to transfer complementary data), the first result signal DS0 becomes low, and the first result signal DS0B becomes high level. Then, the voltage of the output line OUT to transfer data is maintained at the precharge voltage (corresponding to a high level), and the voltage of the output line OUTB to transfer complementary data is pull-down driven (corresponding to a low level). On the other hand, when low data is loaded in the first input line IN_0 to transfer data (high data is loaded in the first input line IN_0B to transfer complementary data), the first result signal DS0 becomes high, and the first result signal DS0B becomes low. Then, the voltage of the output line OUT to transfer data is pull-down driven (corresponding to a low level), and the voltage of the output line OUTB to transfer complementary data is maintained at the precharge voltage (corresponding to a high level).

Even when the data stored in the second storage unit 340_1 are transferred to the output line OUT/OUTB, the data transmission circuit is performed in the same manner as described above.

FIG. 3 illustrates a data transmission circuit having pairs of input lines. However, the number of input lines may differ depending on design. The data transmission circuit of FIG. 3 has the same effect as the data transmission circuit of FIG. 2.

Figure 4:
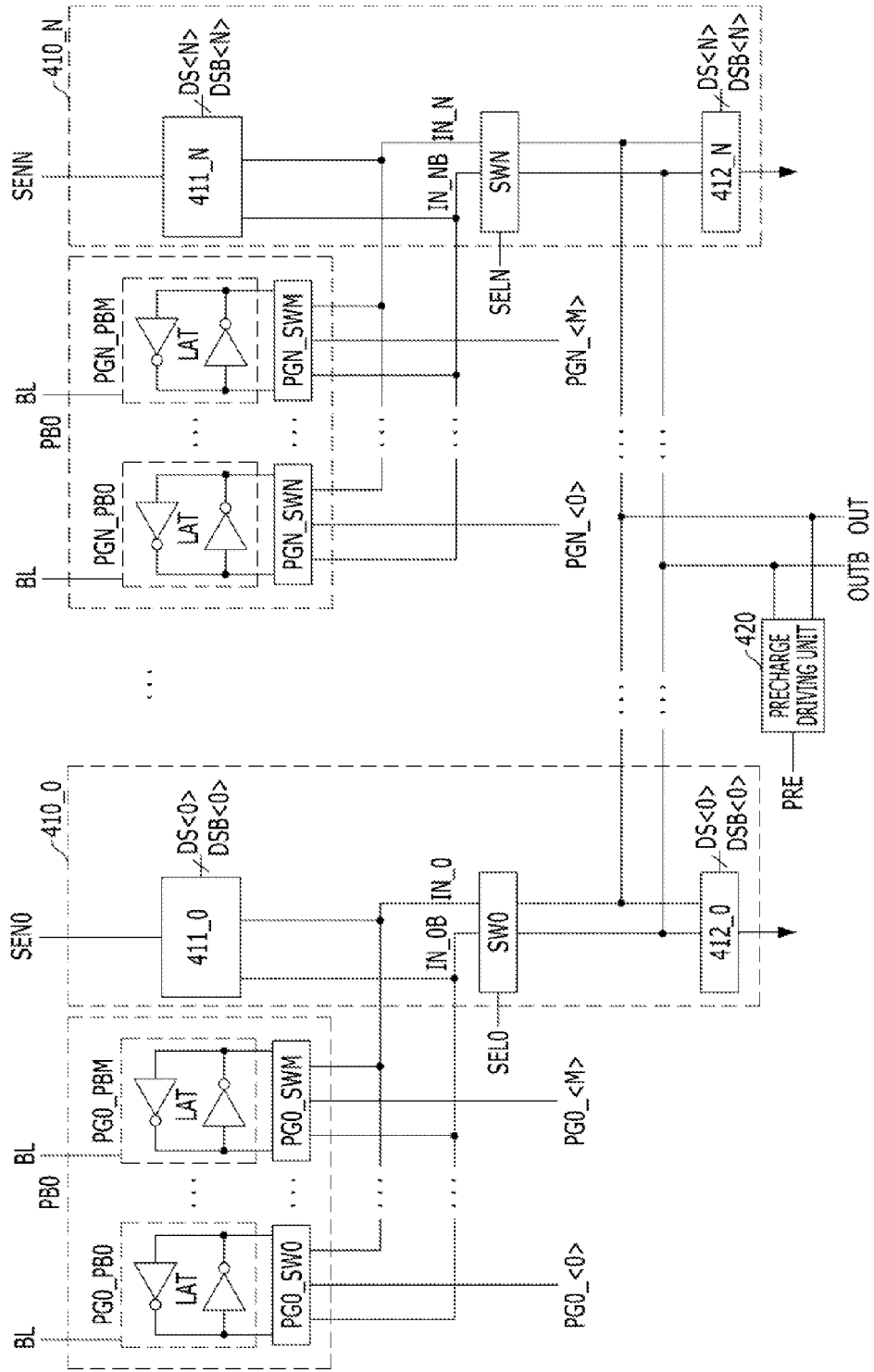
FIG. 4 is a diagram illustrating a memory in accordance with another embodiment of the present invention.

FIG. 4 is a diagram illustrating a memory in accordance with another embodiment of the present invention. The memory of FIG. 4 transfers data to an output line OUT/OUTB using the same principle as the data transmission circuit illustrated in FIG. 2 or FIG. 3.

Referring to FIG. 4, the memory may include a plurality of page buffer groups PG0 to PGN, a plurality of input lines IN_0/IN_0B to IN_N/IN_NB, and a plurality of data transmission units 410_0 to 410_N. The plurality of page buffer groups PG0 to PGN include one or more page buffers PG0_PB0 to PG0_PBM to PGN_PB0 to PGN_PBM each configured to sense and output data of a bit line BL. The plurality of input lines IN_0/IN_0B to IN_N/IN_NB correspond to the respective page buffer groups PG0 to PGN, and each of the input lines IN_0/IN_0B to IN_N/IN_NB is configured to transfer data of a selected page buffer among page buffers included in a corresponding page buffer group. The plurality of data transmission units 410_0 to 410_N correspond to the respective input lines IN_0/IN_0B to IN_N/IN_NB, and each of the data transmission units 410_0 to 410_N is configured to transfer data of a corresponding input line to the output line OUT/OUTB when the corresponding input line is selected, electrically connect the corresponding input line to the output line OUT/OUTB, and amplify the data of the output line OUT/OUTB according to a result obtained by sensing the data on the corresponding input line. The memory may further include a precharge driving unit 420 configured to drive the output line OUT/OUTB to a precharge voltage before the data of the selected input line is sensed.

Referring to FIGS. 2 to 4, the memory will be described.

The plurality of input lines IN_0/IN_0B to IN_N/IN_NB of the memory correspond to the plurality of input lines IN_0/IN_0B to IN_N/IN_NB of the data transmission circuit of FIG. 2 or the first input lines IN_0/IN_0B and the second input lines IN_1/IN_1B of FIG. 3. Furthermore, the output line OUT/OUTB of the memory corresponds to the output line OUT/OUTB of FIG. 2 or the output line OUT/OUTB of FIG. 3. The plurality of page buffer groups PG0 to PGN of the memory correspond to the plurality of data storage units 240_0 to 240_N of FIG. 2 or the first and second storage units 310 and 320 of FIG. 3. The precharge driving unit 420 of the memory corresponds to the precharge driving unit 250 of FIG. 2 or the precharge driving unit 350 of FIG. 3. The operation of the memory to transfer the data of the selected input line among the plurality of input lines IN_0/IN_0B to IN_N/IN_NB to the output line OUT/OUTB is performed in the same manner as described with reference to FIG. 3.

FIG. 3 illustrates a case in which the storage units 310 and 320 corresponding to the respective input lines IN_0/IN_0B and IN_1/IN_1B transfer data to the corresponding input lines without selection. In FIG. 4, however, the page buffer groups PG0 to PGN corresponding to the respective input lines IN_0/IN_0B to IN_N/IN_NB include one or more page buffers PG0_PB0 to PG0_PBM to PGN_PB0 to PGN_PBM, and data stored in a selected page buffer among the page buffers are transferred to the output line OUT/OUTB through the input lines IN_0/IN_0B to IN_N/IN_NB.

The respective page buffers PG0_PB0 to PG0_PBM to PGN_PB0 to PGN_PBM are connected to one or more bit lines BL and configured to store data of the one or more bit lines connected thereto and output the stored data. FIG. 4 illustrates a case in which one bit line BL is connected to each of the page buffers PG0_PB0 to PG0_PBM to PGN_PB0 to PGN_PBM.

Each of the page buffers PG0_PB0 to PG0_PBM to PGN_PB0 to PGN_PBM includes a latch LAT configured to store data of the bit line BL and drives a data transmission line to the value stored therein when the latch LAT is selected. The latch LAT may include a cache latch. Furthermore, the respective page buffers PG0_PB0 to PG0_PBM to PGN_PB0 to PGN_PBM include switches PG0_SW0 to PG0_SWM to PGN_SW0 to PGN_SWM configured to electrically connect the latch LAT to an input line when corresponding buffer selection signals PG0<0:M> to PGN<0:M> are activated.

An operation in which the page buffer senses the voltage of the bit line BL and stores the data of the bit line BL in the cache latch is widely known to those skilled in the art to which the present invention pertains. Therefore, the detailed descriptions thereof are omitted.

The plurality of page buffer groups PG0 to PGN are arranged to be spaced from each other in a first direction (X direction), and the plurality of data transmission units 410_0 to 410_N are arranged between the page buffer groups PG0 to PGN arranged to be spaced from each other. Referring to FIG. 4, the page buffer groups and the data transmission units are alternately arranged. Each of the data transmission units 410_0 to 410_N transfers data of a data transmission line connected to an adjacent page buffer group to the output line OUT/OUTB. The plurality of data transmission units 410_0 to 410_N are arranged between the respective page buffer groups PG0 to PGN, thereby minimizing an area increased by the plurality of data transmission units 410_0 to 410_N.

The data transmission units 410_0 to 410_N include connection units SW0 to SWN, sensing units 411_0 to 411_N, and driving units 412_0 to 412_N, respectively. The connection units SW0 to SWN are configured to electrically connect corresponding data input lines to the output line OUT/OUTB when the corresponding data input lines are selected. The sensing units 411_0 to 411_N are electrically connected to the corresponding data input lines and configured to generate result signals DS<0:N> and DSB<0:N> in response to the voltages of the corresponding data input lines when the corresponding data input lines are selected. The driving units 412_0 to 412_N are configured to drive the output line OUT/OUTB to a predetermined voltage in response to the result signals DS<0:N> and DSB<0:N>.

Based on the above-described configuration, the entire operation of the memory when the data stored in the latch LAT of the page buffer PG0_PB0 is read will be described.

Before a read operation is started, the precharge driving unit 420 drives the output line OUT/OUTB to the same precharge voltage in a state in which the precharge signal PRE is activated. The configuration and operation of the precharge driving unit 420 are the same as those of the precharge driving unit 350 of FIG. 3.

In order to read the data of the page buffer PG0_PB0, the page buffer PG0_PB0 may be selected from the page buffer group PG0, and the data input line IN_0/IN_0B may be selected from the plurality of data input lines IN_0/IN_0B to IN_N/IN_NB. Therefore, the buffer selection signal PG0<0> among the plurality of buffer selection signals PG0<0:N> to PGM<0:N> is activated, and the selection signal SEL0 among the plurality of selection signals SEL0 to SELN is activated.

When the buffer selection signal PG0<0> is activated, the switch PG0_SW0 is turned on to electrically connect the latch LAT of the page buffer PG0_PB0 to the data transmission line IN_0/IN_0B, and when the selection signal SEL0 is activated, the connection unit SW0 among the plurality of connection units SW0 to SWN (corresponding to the plurality of switches SW0 to SWN) connected between the plurality of data input lines IN_0/IN_0B to IN_N/IN_NB and the output line OUT/OUTB is turned on, and the data input line IN_0/IN_0B and the output line OUT/OUTB are electrically connected. As a result, the latch LAT of the page buffer PG0_PB0 and the output line OUT/OUTB are electrically connected.

Furthermore, among the plurality of sensing signals SEN0 to SENN, the sensing signal SEN0 corresponding to the selected data input line is activated. The plurality of sensing signals SEN0 to SENN correspond to the respective sensing units 411_0 to 411_N. Among the plurality of sensing units 411_0 to 411_N, a sensing unit corresponding the activated sensing signal senses data of a data input line connected thereto, and generates the plurality of result signals DS<0:N> and DSB<0:N>. The configurations and operations of the sensing units 411_0 to 411_N are the same as those of the first data sensing unit 310 of FIG. 3. When the sensing signal SEN0 is activated, the sensing unit 411_0 senses the data of the data input line IN_0/IN_0B and generates the result signals DS<0> and DSB<0>. The other result signals DS<1:N> and DSB<1:N> are deactivated.

The plurality of driving units 412_0 to 412_N drive the output line OUT/OUTB to a predetermined voltage in response to corresponding result signals among the plurality of result signals DS<0:N> and DSB<0:N>. The configurations and operations of the driving units 412_0 to 412_N are the same as those of the first driving section 331 shown in FIG. 3. The driving unit 412_0 drives the output line OUT/OUTB to a predetermined voltage in response to the result signals DS<0> and DSB<0>.

The memory in accordance with the embodiment of the present invention may transfer data to the output line OUT/OUTB at high speed, like the data transmission circuits of FIGS. 2 and 3. Since the data is transferred at high speed, the operation of the memory may be performed at high speed. Furthermore, as the data transmission units are arranged between the respective page buffer groups PG0 to PGN as described above, the area is not almost increased even though the plurality of data transmission units are included.

Figure 5:
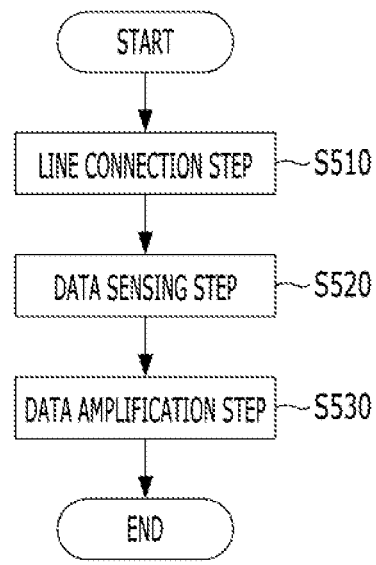
FIG. 5 is a flow chart for explaining a data transmission method in accordance with another embodiment of the present invention.

FIG. 5 is a flow chart for explaining a data transmission method in accordance with another embodiment of the present invention.

Referring to FIG. 5, the data transmission method for transferring data of one input line among the plurality of input lines IN_0/IN_0B to IN_N/IN_NB to the output line OUT/OUTB includes a line connection step S510 of electrically connecting a selected input line among the plurality of input lines IN_0/IN_0B to IN_N/IN_NB to the output line OUT/OUTB, a data sensing step S520 of sensing data of the selected input line, and a data amplification step S530 of amplifying data of the output line OUT/OUTB in response to a data sensing result of the selected input line. The data transmission method may include a precharge step S500 of driving the output line OUT/OUTB to a precharge voltage before the line connection step S510.

Referring to FIGS. 2 and 5, the data transmission method will be described.

At the precharge step S500, the output line OUT to transfer data and the output line OUTB to transfer complementary data are precharged to the same precharge voltage. For this operation, the precharge voltage is applied to the output line OUT to transfer data and the complementary output line OUTB to transfer complementary data, and the output line OUT to transfer data and the complementary output line OUTB to transfer complementary data are electrically connected to each other.

At the line connection step S510, one selection signal of the plurality of selection signals SEL0 to SELN is activated, and a switch corresponding to the activated selection signal is turned on. Therefore, among the plurality of input lines IN_0/IN_0B to IN_N/IN_NB, an input line corresponding to the activated selection signal is electrically connected to the output line OUT/OUTB.

At the data sensing step S520, the data sensing unit 220 senses the data of the selected input line. At this time, the data sensing unit 220 senses the data of the selected input line in response to the voltage of the selected input line.

At the data amplification step S530, the data amplification unit 230 drives the output line OUT/OUTB to a predetermined voltage in response to the data sensing result of the selected input line. According to the data sensing result, the data amplification unit 230 controls one output line, between the output line OUT to transfer data and the complementary output line OUTB to transfer complementary data, to maintain the precharge voltage, and the other output line is pull-down driven to amplify the data of the output line OUT/OUTB.

The data transmission method in accordance with the embodiment of the present invention has the same effect as the data transmission circuit shown in FIG. 2.

In accordance with the embodiments of the present invention, when the data of the input line is transferred to the output line, the input line and the output line are electrically connected, and the data of the input line is sensed to additionally amplify the output line. Accordingly, the data of the input line is quickly transferred to the output line.

Furthermore, since the data of the input line is quickly transferred, the high-speed operation of the memory is guaranteed.

Although various embodiments have been described for illustrative purposes, it will be apparent to those skilled in the art that various changes and modifications may be made without departing from the spirit and scope of the invention as defined in the following claims.

What is claimed is:

1. A data transmission circuit comprising: an input line selection unit configured to transfer data of a selected input line among a plurality of input lines to an output line; a data sensing unit: connected to the plurality of input lines and configured to sense the data of the selected input line; and a data amplification unit configured to amplify data of the output line in response to a data sensing result of the data sensing unit;

wherein the data sensing unit comprises a plurality of unit sensing units each electrically connected to a corresponding input line among the plurality of input lines and configured to generate a result signal in response to the voltage level of the data of the corresponding input line when the corresponding input line is selected;

wherein the data amplification unit comprises a plurality of unit driving units each configured to drive the output line to a predetermined voltage in response to a result signal of a corresponding unit sensing unit among the plurality of unit sensing units.

2. The data transmission circuit of claim 1, wherein the input line selection unit electrically couples the selected input line to the output line.

3. The data transmission circuit of claim 1, wherein the data sensing unit senses the data of the selected input line in response to a voltage level of the data of the selected input line.

4. The data transmission circuit of claim 1, wherein the data amplification unit drives the output line to a predetermined voltage in response to the data sensing result of the data sensing unit.

5. The data transmission circuit of claim 1, wherein the input line selection unit comprises a plurality of unit connection units each configured to electrically connect a corresponding input line among the plurality of input lines to the output line when the corresponding input line is selected.

6. The data transmission circuit of claim 1, further comprising a precharge driving unit configured to drive the output line to a precharge voltage before the data of the selected input line is sensed.

7. A data transmission circuit comprising:
a first data sensing unit configured to sense data of a first input line in response to a first sensing signal and to generate a first result signal;
a second data sensing unit configured to sense data of a second input line in response to a second sensing signal and to generate a second result signal;
a first switch configured to electrically connect the first input line and an output line in response to a first selection signal;
a second switch configured to electrically connect the second input line and the output line in response to a second selection signal; and
a data amplification unit configured to amplify data of the output line in response to an activated result signal of the first and second result signals,
wherein the data amplification unit comprises:
a first driving unit configured to drive the output line to a predetermined voltage in response to the first result signal; and a second driving unit configured to drive the output line to a predetermined voltage in response to the second result signal.

8. The data transmission circuit of claim 7, wherein the first data sensing unit generates the first result signal in response to a voltage level of the first input line when the first sensing signal is activated, and the second data sensing unit generates the second result signal in response to a voltage level of the second input line when the second sensing signal is activated.

9. The data transmission circuit of claim 7, further comprising a precharge driving unit configured to drive the output line to a precharge voltage before the data of the first and second input lines are sensed.

10. A memory comprising:
 a plurality of page buffer groups each comprising one or more page buffers configured to sense and output data of a bit line;
 a plurality of data transmission lines corresponding to the respective page buffer groups and each configured to transfer data of a selected page buffer among the page buffers included in a corresponding page buffer group; and
 a plurality of data transmission units corresponding to the respective data transmission lines and each configured to transfer data of a corresponding data transmission line to an output line when the corresponding data transmission line is selected, electrically connect the corresponding data transmission line to the output line, and amplify data of the output line according to a sensing result obtained by sensing data on the corresponding data transmission line,
 wherein each of the data transmission units comprises:
  a connection unit configured to electrically connect the data transmission line corresponding to the data transmission unit to the output line when the corresponding data transmission line is selected;
  a sensing unit electrically connected to the corresponding data transmission line and configured to generate a result signal in response to a voltage level of the corresponding data transmission line when the corresponding data transmission line is selected; and
  a driving unit configured to drive the output line to a predetermined voltage in response to the result signal.

11. The memory of claim 10, wherein the plurality of page buffer groups are arranged to be spaced from each other in a first direction, and the data transmission units are arranged between the respective page buffer groups.

12. The memory of claim 10, wherein each of the page buffers is connected to one or more bit lines and configured to store data of the one or more bit lines connected thereto and output the stored data.

13. The memory of claim 10, further comprising:
 a precharge driving unit configured to drive the output line to a precharge voltage before the data of the selected data transmission line is sensed.

14. The memory of claim 10, wherein each of the page buffers comprises a latch configured to store data of the bit line and to drive the data transmission line to the value stored therein, when the page buffer is selected.

* * * * *